(12) United States Patent
Dudderar et al.

(10) Patent No.: US 6,205,745 B1
(45) Date of Patent: Mar. 27, 2001

(54) HIGH SPEED FLIP-CHIP DISPENSING

(75) Inventors: Thomas Dixon Dudderar, Chatham, NJ (US); Charles Gutentag, Los Angeles, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/134,843

(22) Filed: Aug. 14, 1998

Related U.S. Application Data

(63) Continuation-in-part of application No. 09/085,643, filed on May 27, 1998, now Pat. No. 5,966,903.

(51) Int. Cl.[7] ................................................. B65B 11/00
(52) U.S. Cl. ........................... 53/397; 414/416; 29/743; 221/74
(58) Field of Search .................. 53/397, 452; 29/740, 29/743; 414/416; 156/584; 221/70, 71, 72, 73, 74

(56) References Cited

U.S. PATENT DOCUMENTS

| 4,494,902 | * | 1/1985 | Kuppens et al. | 221/74 |
| 5,203,143 | * | 4/1993 | Gutentag | 53/452 |
| 5,319,846 | * | 6/1994 | Takahashi et al. | 29/740 |

FOREIGN PATENT DOCUMENTS

| 5-32217 | * | 2/1993 | (JP) | 53/397 |
| 5-132021 | * | 5/1993 | (JP) | 53/397 |

* cited by examiner

*Primary Examiner*—Peter Vo
*Assistant Examiner*—Louis K. Huynh
(74) *Attorney, Agent, or Firm*—Peter V. D. Wilde

(57) ABSTRACT

The specification describes a method for dispensing IC chips from a chip carrier tape for a flip-chip assembly operation. In a conventional assembly operation, the solder bumped side of the chip is the top side of the chip as loaded on the tape, and is normally the side of the chip that engages the head of the pick tool. For flip-chip assembly it is necessary to invert the chip for solder bonding to an interconnect substrate. In the technique of the invention, the chip carrier tape is inverted and inserted into the dispensing machine upside down. The IC chips are then ejected through the back of the tape instead of being lifted from the from of the tape. In this way the pick tool head engages the back side of the solder bumped chip and the chip is in the proper orientation for flip-chip placement and bonding on the interconnect substrate. Carrier tapes designed for through-tape dispensing are also disclosed.

4 Claims, 6 Drawing Sheets

HIGH SPEED FLIP-CHIP DISPENSING

REFERENCE TO PRIOR APPLICATIONS

This application is filed under 37 CFR 1.53 as a continuation-in-part of U.S. patent application Ser. No. 09/085,643, filed May 27, 1998, now U.S. Pat. No. 5,966, 903, and claims the benefit of that filing date for all common subject matter.

FIELD OF THE INVENTION

This invention relates to techniques and related apparatus for semiconductor chip handling and more specifically to methods for transferring chips from chip carrier tapes to other processing stations.

BACKGROUND OF THE INVENTION

A variety of systems for conveying finished integrated circuit (IC) chips from the IC singulation operation to the IC packaging operation are available commercially. Many of these systems use an apertured punched plastic carrier tape with a pressure sensitive adhesive backing, hereinafter referred to as carrier tape, as more particularly described in Industry Standard, EIA/IS-747, published by the Electronic Industries Association, Arlington, Va. Chips are mounted in the apertures with a pick and place tool, and are retained in the apertures by the pressure sensitive adhesive backing, hereinafter referred to as adhesive backing. A widely used carrier tape system uses two parallel rails of adhesive backing which extend along the underside of the apertured plastic tape, hereinafter referred to as the plastic carrier. See, e.g. U.S. Pat. No. 5,203,143, issued Apr. 20, 1993. After the carrier tapes are loaded, the tapes can be conveyed directly to the next assembly operation, or more typically, are reeled for temporary storage. Tapes are then unreeled and the chips are picked from the carrier tape to be placed in a package assembly machine. With conventional pick and place tools the chips, which are carried circuit side up on the carrier tape, are seized on the circuit side by the vacuum head of the pick and place machine, and inserted circuit side up in the next assembly station. For normal surface mount and wire bonded packages the circuit side up position of the chip is the orientation desired. However, for flip-chip packages, this orientation is upside down.

Various methods have been employed to adapt carrier tape systems for flip-chip packaging. One of these is the Bare Die Dispensing System available from Tempo Electronics, Los Angeles, Calif. In this equipment, an inverter arm is used to pick the die from the carrier tape in the usual way, i.e. circuit side up, swing the arm of the pick tool through a 180° arc, then pick the die with a second pick tool from the first pick tool, this time with the circuit side down. While this method is satisfactory, the use of two pick operations slows the chip handling operation and contributes error to chip position repeatability at the pick point. Other solutions for adapting carrier tape systems to flip-chip packaging are needed.

SUMMARY OF THE INVENTION

We have designed a carrier tape system for flip-chip assembly where the chip can be loaded on the carrier tape circuit side up in the usual manner, and can be picked from the carrier tape and placed circuit side down in a single pick operation. In one embodiment the system uses essentially the same equipment used in the conventional arrangement, and uses essentially the same carrier tape. In other embodiments, the carrier tape has a new design specifically intended for this invention, and in yet other embodiments the apparatus is modified to create the new carrier tape in situ. The feature that is common to all embodiments, according to the invention, is to pick the chip from the back side of the carrier tape. The vacuum head of the pick tool then contacts the back side of the IC chip, and dispenses the chip circuit side down without any additional handling. To facilitate back side dispensing, or through-tape dispensing, the adhesive backing of the tape is advantageously modified by providing discrete apertures at the chip sites in place of the continuous dual rail adhesive backing.

DETAILED DESCRIPTION

Figure 1:
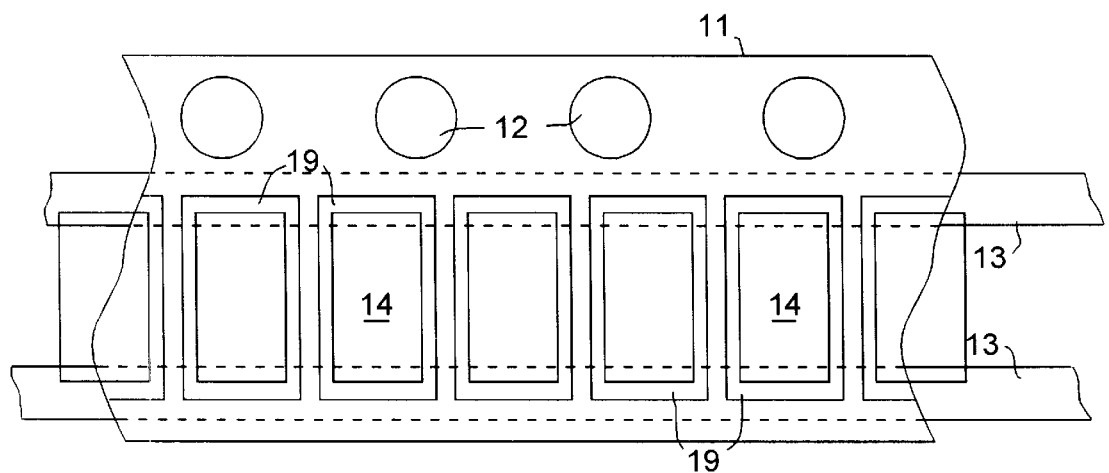
FIG. 1 is a schematic plan view of a conventional IC carrier tape.

Referring to FIG. 1 an adhesive backed punched plastic carrier tape is shown at 11 with sprocket holes 12 for controllably reeling the tape through the dispensing apparatus. The sprocket holes also serve as alignment means for coordinating the movement of the tape and the pick and place tools. The chip sites are shown at 19 which are simply openings through the carrier tape 11. The IC chips are shown at 14, and rest on the adhesive backing rails 13. The rails 13 are coated on the chip side of the rails with a low adhesion polymer to retain the chips in place. The adhesive backing can be any of a variety of flexible tapes. A well known example is Nitto tape which is widely used in the industry. The plastic carrier can be any suitable thick flexible high strength material. An example is SurfTape® manufactured by Tempo Electronics, Los Angeles, Calif.

In a typical chip manufacturing operation, the processed wafers are singulated in a dicing machine and the individual chips are placed in a carrier tape 11 as shown in FIG. 1. The tape may be conveyed as a conveyer belt to a subsequent processing station but is more typically reeled and the reel is taken to the first packaging station. Here the individual chips are dispensed from the tape by a pick and place tool and placed in a die bonder or mounted on an interconnect substrate for solder bonding. In the example shown in FIGS. 2–4 the chips 14 are solder bumped with solder bumps 15, and ready for surface mounting on an interconnect substrate.

Figure 2:
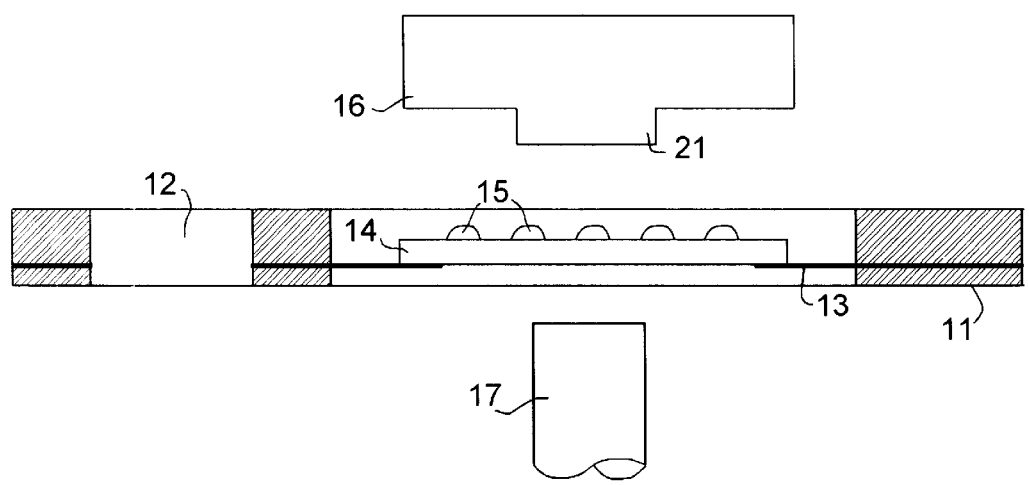
FIGS. 2–4 are schematic representations of the conventional sequence of operations for dispensing IC chips from a carrier tape.
Figure 3:
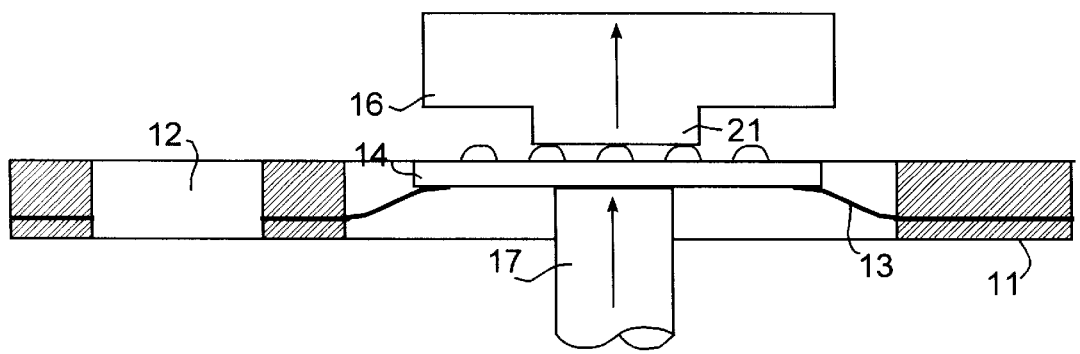
Figure 4:
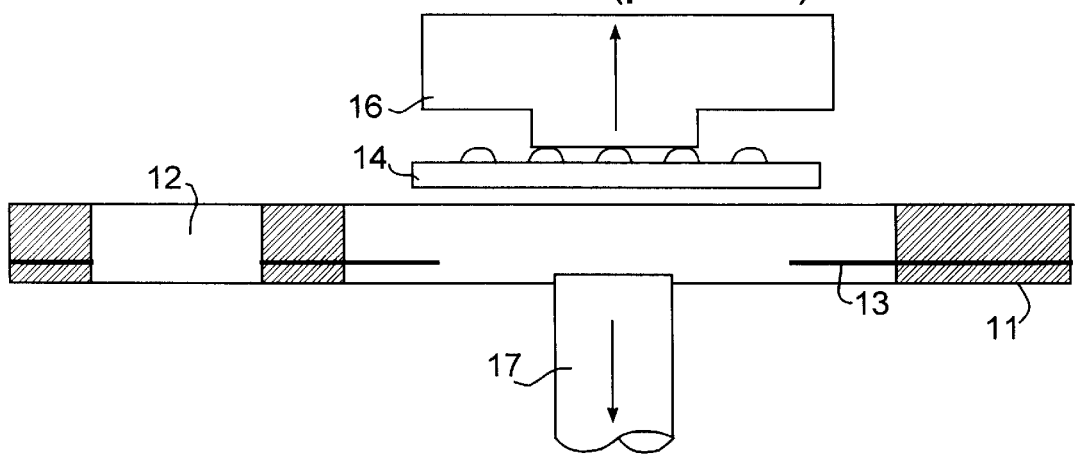

The typical dispensing operation is shown in FIGS. 2–4, where the unreeled tape 11 is stepped through a dispensing apparatus and the individual die 14 are picked from the carrier tape 11 by the pick and place tool 16. The pick and place tool is conventional and typically consists of a vacuum head 21 attached to a micromanipulator arm that picks the chips from the carrier tape and places them on the package substrate (not shown). The dispensing operation is enabled with the use of a die ejector pin 17, which as shown in FIG. 3, lifts the chip 14 from the carrier tape 13 to engage the vacuum head 21 of the pick and place tool 16. The carrier tape is stepped into position for this operation by sprockets that engage the sprocket holes 12. The operation of the pick and place tool, the die ejector pin, and the movement of the carrier tape, are coordinated in a manner that allows chips to be dispensed at a rate of several per second. The timing of the operation of the die ejector pin and the vacuum head are such that the adhesive backing of the carrier tape peels from the back of the chip as shown in FIG. 3, prior to raising the vacuum head, so that twisting or rotation of the chip is minimized. FIG. 4 shows the dispensing operation completed, and the chip ready to be moved to the placement site.

The foregoing operation is used successfully in a variety of chip handling applications. However, complications arise when the dispensing apparatus is used in a flip-chip assembly operation. This is due to the fact that for a flip-chip package the chip arrives at the pick and place tool 16 active side up, and must be inverted prior to placement on the interconnect substrate. Apparatus is available for inverting the chip prior to the pick and place operation but that apparatus essentially involves an additional pick and place tool, which as mentioned earlier adds complexity to the operation and, more importantly, reduces accuracy and significantly slows the overall operation.

Figure 5:
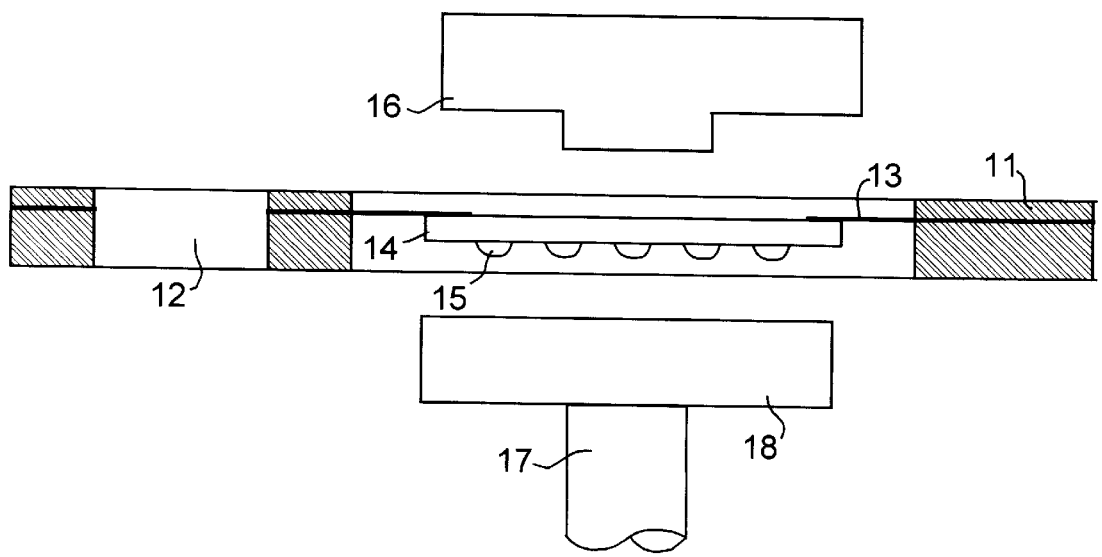
FIGS. 5–8 are schematic representations of the sequence of the invention for dispensing IC chips from the back side of a carrier tape.
Figure 6:
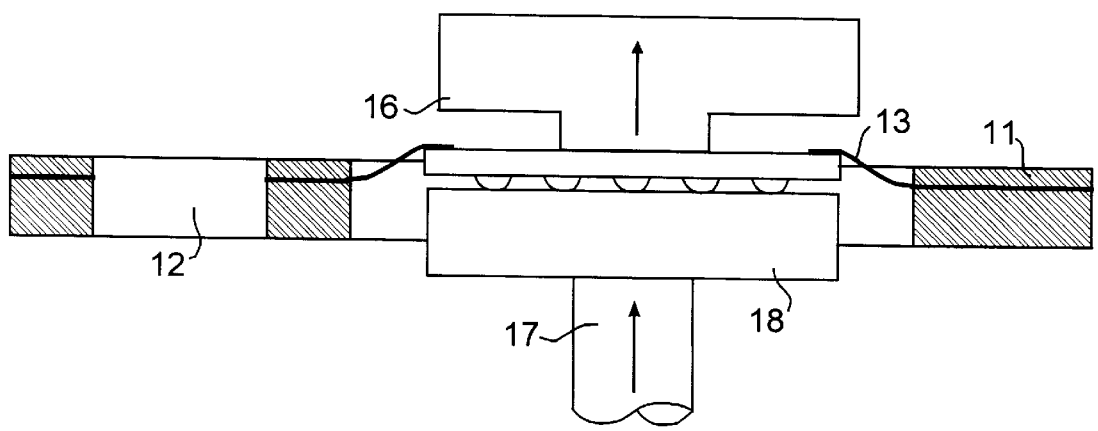
Figure 7:
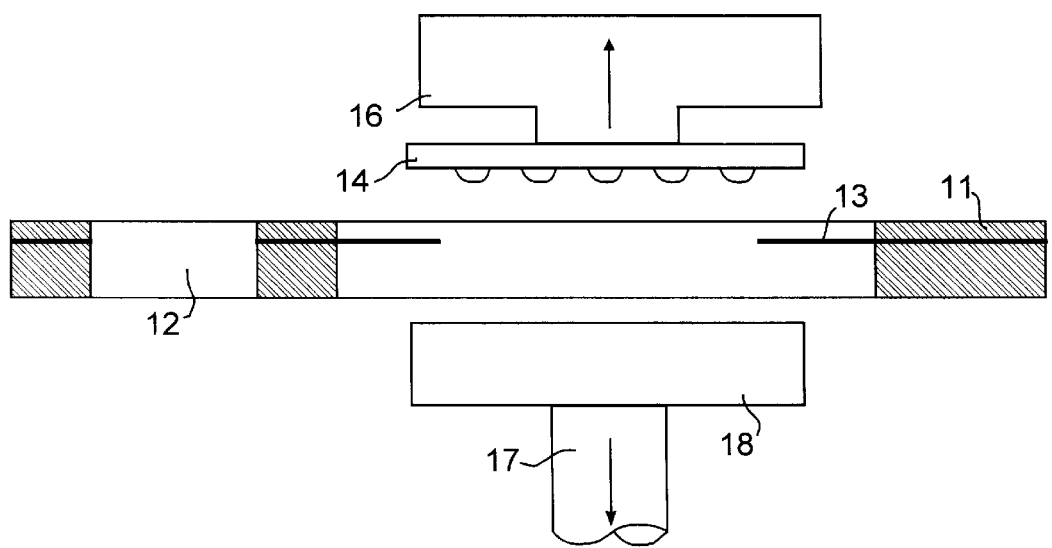

The modification of the dispensing operation according to the invention is shown in FIGS. 5–7. The essential feature of this modified dispensing operation is that the carrier tape and the pick tool are oriented so that the active side of the chips are facing the vacuum head of the pick tool. Since the chips are loaded onto the carrier tape at the singulation stage with the active side up, i.e. the back of the chip contacts the adhesive backing 13, either the tape or the vacuum head must be inverted with respect to each other. In the embodiment shown in FIGS. 5–7, the carrier tape is inverted and inserted "upside down" into the dispensing apparatus. This can be achieved following one of several options. The carrier tape can be reeled "backwards" from the singulation operation. The carrier tape can be re-reeled to reverse the tape. Or the carrier tape can be inverted in the dispensing equipment. Yet another option is to exchange the position of the pick and place vacuum head and the die ejector pin in the configuration shown in FIG. 5, and use the carrier tape in the conventional orientation. In this mode the die ejector pin pushes from the top and the vacuum head picks from the bottom. The pick and place tool is then rotated 180° to place the chip. Rotating the vacuum head is relatively simple and rapid compared with interjecting an additional pick and place operation as in the prior art approach.

Following any of these options, the carrier tape is stepped to the dispensing station with the carrier tape oriented upside down with respect to the ejector pin and pick tool. The essence of the invention is the recognition that the chip can be pushed through the bottom of the carrier tape rather than lifted from the top. This is shown in FIG. 5 where the ejector pin 17 and the chip 14 are on the same side of the adhesive backing 13, and the ejector pin engages the active side of the chip 14 rather than the back side as in FIGS. 2–4. Since the ejector pin is incident on the circuit side of the chip it is preferred in this arrangement for the ejector pin to be provided with a pad 18 to reduce the risk of damage to the IC and to inhibit rotational movement of the die during release from the adhesive backing. Typical IC chips at this stage in the fabrication sequence have a protective coating of SINCAPS or polyimide covering the surface of the IC metallization in part to reduce the incidence of damage in handling and packaging. However, the additional precaution of padding the ejector tip may be taken.

The dispensing sequence of the invention is continued in FIG. 6 wherein the chip 14 is shown being pushed through the bottom of the carrier tape 11. It has been demonstrated that the ejection of the chip through the adhesive backing 13 in the manner shown can be achieved reliably and rapidly. The dispensing operation is shown completed in FIG. 7, with chip 14 oriented with active side down, as required for the placement of the flip-chip on the interconnection substrate.

Figure 8:
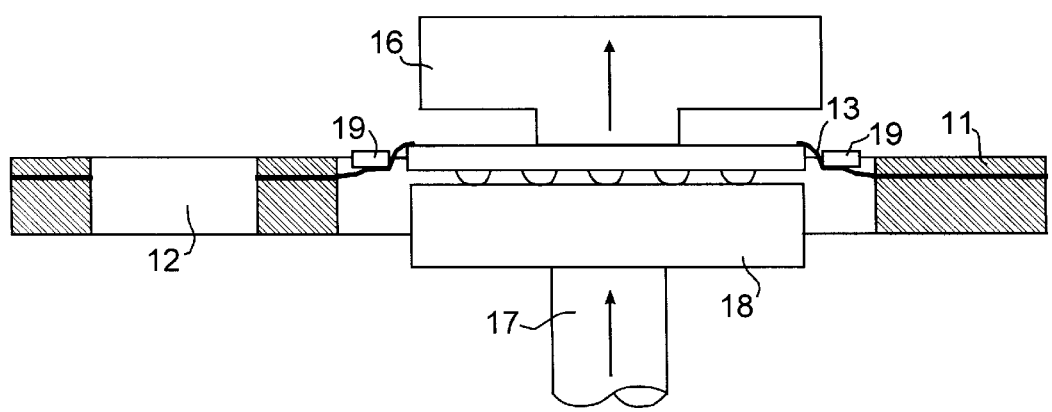

The dispensing operation of the invention may be further aided by the use of an aperture plate, as shown at 19 in FIG. 8. The aperture plate is a simple frame that is positioned as shown during lift-off of the chip 14 from the adhesive backing 13. This expedient is especially useful when the chip is relatively small, i.e. when a relatively large gap exists between the edge of the chip and the edge of the opening in the carrier tape. Other means for facilitating lift-off may also be found helpful. For example, the tape edges can be serrated or slit. Also, the back of the chips may be roughened to decrease the adhesive force between the tape and the chip.

While the use of dual rail adhesive backing for the carrier tape as described above offers high performance when used in the push through dispensing mode of the invention, other forms of carrier tapes can be used which are designed specifically for the through-tape dispensing mode. Three of these are shown in FIGS. 9–14. In each of these embodiments the adhesive backing on the carrier tape is a single adhesive tape, with a width greater than the chip width, and the adhesive backing is provided with individual apertures at the chip sites. The variation between embodiments is primarily in the shape of the aperture.

Figure 9:
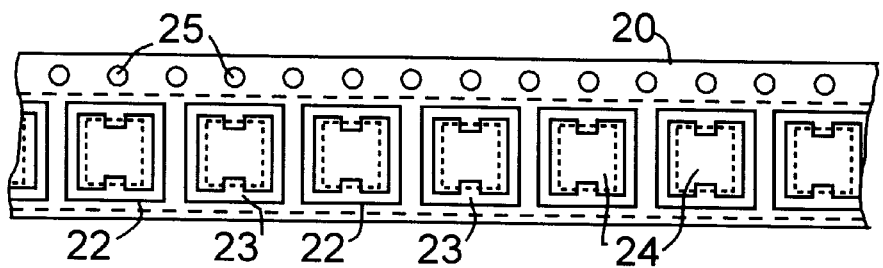
FIG. 9 is a diagram of an improved carrier tape designed for use with the through-tape dispensing method of the invention.
Figure 10:
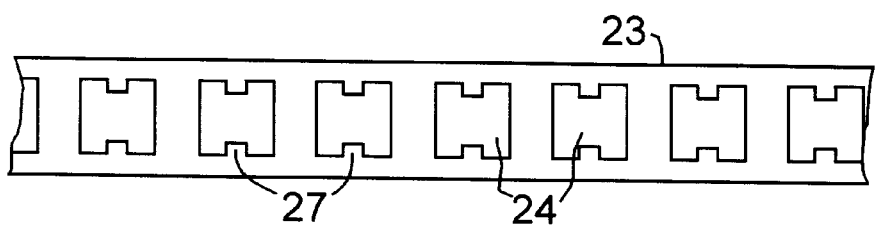
FIG. 10 is a view of the adhesive backing of the carrier tape of FIG. 9 separated from the plastic carrier.

With reference to FIG. 9, a modified carrier tape is shown at 20, with square (or optionally rectangular) windows 22 at the chip sites as shown. The windows 22 are the openings in the thick plastic carrier. Portions of the adhesive backing for the carrier tape appear at 23 in each of the windows 22. The apertures in the adhesive backing are shown at 24. Sprocket holes in the carrier tape are shown at 25. The chips, after mounting on the tape, will occupy the space shown in phantom. The adhesive backing, separated from the plastic carrier, is shown in FIG. 10. The apertures 24, as evident from the chips shown in phantom in FIG. 9, are larger than the chip area. Each aperture 24 is provided with one or more tabs 27, which provide the adhesive contact surfaces for holding the chips.

Figure 11:
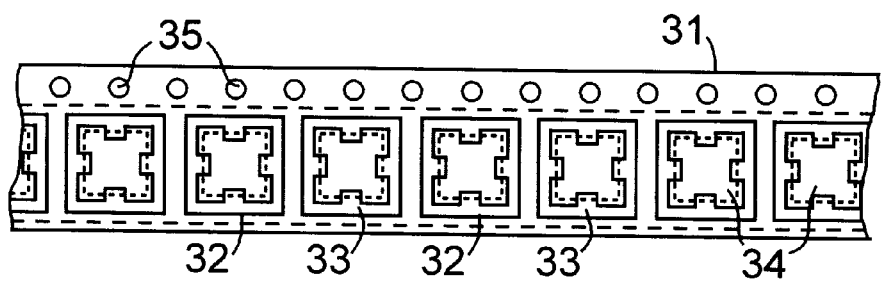
FIG. 11 is a diagram of another embodiment of an improved carrier tape designed for use with the through-tape dispensing method of the invention.
Figure 12:
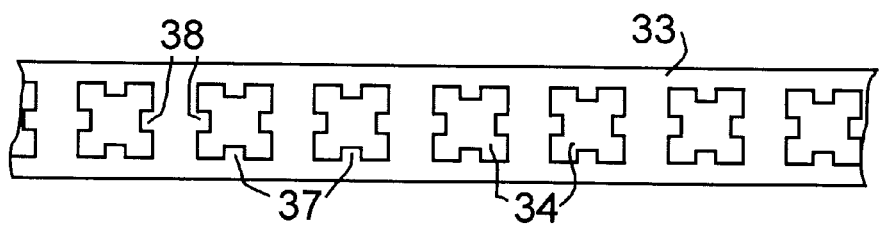
FIG. 12 is a view of the adhesive backing of the carrier tape of FIG. 11 separated from the plastic carrier.

Another embodiment of a carrier tape with discrete apertures in the adhesive backing is shown in FIG. 11. The continuous carrier tape is shown at 31, with windows 32, portions of the adhesive backing 33, apertures 34 in the adhesive backing, and sprocket holes 35. The chip sites are shown in phantom. The adhesive backing 33, separated from the plastic carrier 31, is shown in FIG. 12. As with the tape of FIG. 10, the apertures 34 are larger than the chip area, but additional tabs 38 are provided which, in combination with tabs 37, ensure adhesive contact with each of the four edges of the chip.

Figure 13:
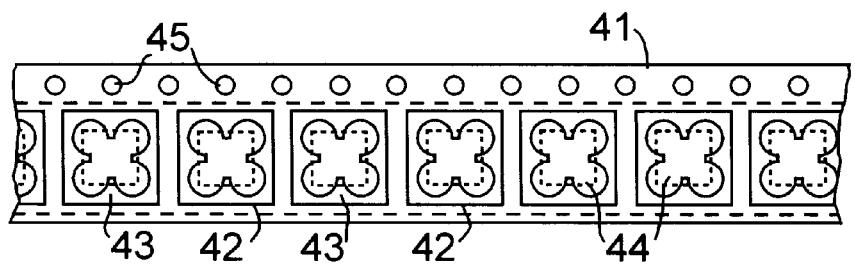
FIG. 13 is a diagram of another embodiment of an improved carrier tape designed for use with the through-tape dispensing method of the invention.
Figure 14:
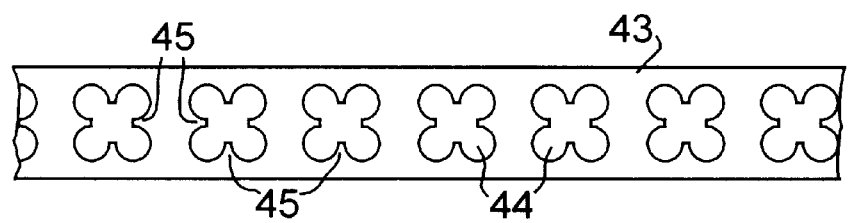
FIG. 14 is a view of the adhesive backing of the carrier tape of FIG. 13 separated from the plastic carrier.

A further embodiment of a carrier tape with discrete apertures in the adhesive backing is shown in FIG. 13. The continuous carrier tape is shown at 41, with windows 42, portions of the adhesive backing 43, apertures 44 in the adhesive backing, and sprocket holes 45. The chip sites are shown in phantom. The adhesive backing 43, separated from the plastic carrier 41, is shown in FIG. 14. As with the carrier tape of FIGS. 10 and 12, the apertures 44 are larger than the chip area. The tabs 45 ensure adhesive tab contact with each of the four edges of the chip.

The carrier tape designs of FIGS. 9–14 represent preferred embodiments of the invention. In an alternative design the apertures may be smaller than the chips, so that the adhesive contact area extends around the periphery of the chips. In this case it is desirable to have a plurality of slits at the edges of the apertures. Another alternative is to form apertures with length L and width W, to accommodate chips with length $L_1$ and width $W_1$, where $L > L_1$ and $W < W_1$, or where $L < L_1$ and $W > W_1$.

Figure 15:
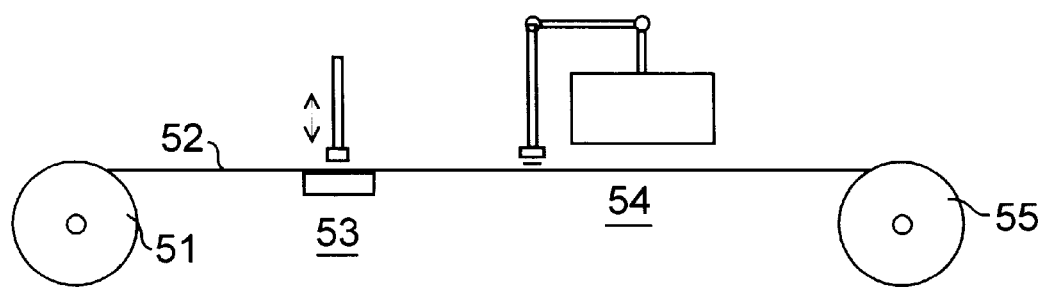
FIG. 15 is a schematic representation of a chip loading apparatus with a carrier tape stamping station showing a further embodiment of the invention.

For optimum performance the apertures in the adhesive backing are custom fitted to the size of the chips being carried. The custom fit may be approached using different strategies. The adhesive backing on the carrier tapes can be pre-punched by the carrier tape supplier, and provided to the assembly operation in punched form. Alternatively, and according to an embodiment of the invention, the adhesive backing on the carrier tapes is punched in situ, i.e., as part of the initial chip sorting operation. A suitable apparatus for achieving this is shown schematically in FIG. 15. The new carrier tape is provided reeled on reel 51. The carrier tape 52 is passed first into a punch station 53 where the adhesive backing on the carrier tape is punched to form apertures custom fitted to the chips being processed. The carrier tape then proceeds to a loading station 54, where the chips are loaded onto the tape carrier with a conventional pick and place tool. The loaded tape is then reeled on take up reel 55 to be ready for the next assembly operation. The means for conveying the carrier tape from one station to another generally comprises drive sprockets which engage the sprocket holes in the carrier tape and coordinate the movement of the tape with the station operations.

Punching the apertures in the adhesive backing after the adhesive backing and the plastic carrier are assembled together allows effective registration of the apertures in the adhesive backing to the sprocket holes on the carrier tape. However, the adhesive backing can alternatively be punched and then applied to the plastic carrier. To ensure proper registration in this case, the adhesive backing can be made wide enough to extend over the sprocket holes of the carrier tape. To ensure proper overall alignment, the adhesive backing is punched with sprocket holes corresponding to those of the carrier tape in the same operation used for punching the apertures. Other means of registration will occur to those skilled in the art.

Reference herein to solder bumps and solder bumped chips refers to the use of solder interconnections of any form or configuration, e.g. balls, paste etc.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for handling and dispensing IC chips using a chip carrier tape, said IC chips having a back side and a front side, with solder bumps on said front side, comprising the steps of:

a. placing said IC chips in chip site openings on said chip carrier tape, said chip carrier tape comprising a flexible tape with a front side and a back side, with chip site openings extending through said chip carrier tape, said chip site openings having an adhesive backing extending along the back side of the chip carrier tape, said adhesive backing having an aperture at each of said chip site openings, b. loading a plurality of solder bumped IC chips in said chip site openings with a first edge portion of the back side of said IC chips adhesively engaging said adhesive backing, and a second edge portion of the back side of said IC chips adhesively engaging said adhesive backing, c. reeling said chip carrier tape, d. inserting said reeled chip carrier tape into a dispensing apparatus, said dispensing apparatus having a vacuum actuated pick tool head and an ejector pin spaced from said pick tool head, e. unreeling said chip carrier tape and moving the chip carrier tape so that said chip carrier tape traverses the space between said pick tool head and said ejector pin, with said pick tool head located on a first side of said chip carrier tape and said ejector pin located on a second side of said chip carrier tape, said first side corresponding to the back side of said chip carrier tape, and said second side corresponding to said front side of said chip carrier tape, f. intermittently stopping the movement of said chip carrier tape with a selected one of said plurality of IC chips in the space between said pick tool head and said ejector pin, g. moving said pick tool head into close proximity to the back side of said selected IC chip, h. moving said ejector pin to engage the front side of said selected IC chip, and to push said selected IC chip toward the front side of said chip carrier tape and through said aperture in said adhesive backing so as to disengage the selected IC chip from said adhesive backing and to engage said pick tool head.

2. The method of claim 1 in which the ejector pin is provided with a resilient polymer surface and the resilient polymer surface engages said selected IC chip.

3. The method of claim 1 further including, in conjunction with step g., positioning a dispensing aperture plate around the periphery of said aperture in said adhesive backing, said dispensing aperture and said aperture in said adhesive backing being essentially congruent.

4. The method of claim 1 in which the said aperture is larger than said IC chip and the apertures are provided with tabs to engage the edges of the IC chips.

* * * * *